US006306693B1

(12) United States Patent
Ishiguro et al.

(10) Patent No.: US 6,306,693 B1
(45) Date of Patent: Oct. 23, 2001

(54) METHOD OF MANUFACTURING SEMICONDUCTOR DEVICE, METHOD OF MANUFACTURING ACTIVE MATRIX SUBSTRATE, AND ELECTROOPTIC DEVICE

(75) Inventors: Hideto Ishiguro; Minoru Matsuo, both of Suwa; Hiroyuki Murai; Masami Hayashi, both of Tokyo, all of (JP)

(73) Assignees: Seiko Epson Corporation; Mitsubishi Denki Kabushiki Kaisha, both of Tokyo (JP)

( * ) Notice: Subject to any disclaimer, the term of this patent is extended or adjusted under 35 U.S.C. 154(b) by 0 days.

(21) Appl. No.: 09/657,901

(22) Filed: Sep. 8, 2000

(30) Foreign Application Priority Data

Oct. 9, 1999 (JP) ................................................ 11-257697

(51) Int. Cl.[7] ..................................................... H01L 21/00

(52) U.S. Cl. ............................. 438/149; 438/151; 438/30

(58) Field of Search .................................... 438/149–152, 438/30, 24, 22, 23, 34–41, 45, 59–60, 303–304

(56) References Cited

U.S. PATENT DOCUMENTS 6,235,559 * 5/2001 Kuo ...................................... 438/149
6,235,561 * 5/2001 Selki et al. ........................... 438/151

FOREIGN PATENT DOCUMENTS 5-152325 6/1993 (JP) .

* cited by examiner

*Primary Examiner*—Jey Tsai
(74) *Attorney, Agent, or Firm*—Oblon, Spivak, McClelland, Maier & Neustadt, P.C.

(57) ABSTRACT

To provide a method of manufacturing a semiconductor device, a method of manufacturing an active matrix substrate, and an electrooptic device in which in forming different type TFTs on the same substrate, a variation in the LDD length or offset length of TFT can be suppressed by a small number of steps. In the method of manufacturing an active matrix substrate, a patterning mask 554 used for forming gate electrodes 15 and 25 is left, and used in introducing a medium concentration of phosphorus ion to introduce impurities in self alignment with the patterning mask 554. Next, with the patterning mask 554 removed, low-concentration of phosphorus ion is introduced by using the gate electrodes 15 and 25 as a mask to form low-concentration source-drain regions 111, 121, 211 and 221 in self alignment with the gate electrodes 15 and 25. The LDD length of each of the regions is equal to the amount of side etching caused in patterning the gate electrodes 15 and 25.

11 Claims, 12 Drawing Sheets

43
402
401
142
141
201
200
8
17
41
42
40
14
141
142
112
113
111
11
15
13
121
10
123
122
12
16
26
212
213
211
21
25
20
23
221
223
222
22
27
35
30
32
36
33
31

1
2
3
80
70
70
H'
H
88
83
82
60
81

METHOD OF MANUFACTURING SEMICONDUCTOR DEVICE, METHOD OF MANUFACTURING ACTIVE MATRIX SUBSTRATE, AND ELECTROOPTIC DEVICE

BACKGROUND OF THE INVENTION

1. Field of the Invention

The present invention relates to a method of manufacturing a semiconductor device comprising a thin film transistor (referred to as "TFT" hereinafter), a method of manufacturing an active matrix substrate, and an electrooptic device comprising the active matrix substrate. More specifically, the present invention relates to a technique for forming LDD structure or offset gate structure TFT.

2. Description of the Related Art of various types of semiconductor devices, an active matrix substrate with a built-in driving circuit of an electrooptic device such as a liquid crystal display device or the like, or an active matrix substrate of a current drive control-type display device comprises TFT as a pixel switching element or a switching element which constitutes a driving circuit. In order to improve the electric strength of TFT or reduce an off-leak current in an active matrix substrate, a technique is frequently used for imparting an offset gate structure or LDD structure to TFT.

Such a LDD structure or offset structure TFT is conventionally produced by the following method.

First, as shown in FIG. 10B, an under protecting film (not shown) and a silicon film 1012 (semiconductor film) are formed in turn on a substrate 11 shown in FIG. 10A. Then, as shown in FIG. 10C, the silicon film 1012 is patterned to form an island-like silicon film 1012. Next, as shown in FIG. 10D, a gate insulating film 1013 is formed on the surface of the silicon film 1012, and then a conductive film is formed on the surface thereof, and patterned to form a gate electrode 1014.

In producing LDD structure N-type (first conduction type) TFT, as shown in FIG. 10E, low concentration N-type (low concentration first conduction type) impurities such as phosphorus ions or the like are next introduced into the silicon film 1012 by using the gate electrode 1014 as a mask. As a result, low-concentration n-type regions 1151 are formed in the silicon film 1012 in self alignment with the gate electrode 1014, the portion in which the impurities are not introduced serving as a channel forming region 1017.

Next, as shown in FIG. 10F, a resist mask 1055 is formed to cover a region slightly wider than the gate electrode 1014, and then as shown in FIG. 10G, high-concentration N-type (high concentration first conduction type) impurities such as phosphorus ions are introduced into the silicon film 1012.

As a result, a portion of each of the low-concentration N-type regions 1151 becomes a high-concentration N-type region 1152.

Next, as shown in FIG. 10H, an interlayer insulating film 1018 is formed on the surface side of the gate electrode 1014, a contact hole is formed in the interlayer insulating film 1018, and then source and drain electrodes 1051 and 1052 are formed to be electrically connected to the high-concentration N-type regions 1152 through the contact hole of the interlayer insulating film 1018.

The thus-constructed TFT 1010 has the LDD structure in which portions of the source drain regions 1015 to which the source and drain electrodes 1051 and 1052 are electrically connected are the high-concentration N-type regions 1152, portions confronted to each other with the gate insulating film 1013 provided therebetween at the ends of the gate electrodes 1015 being the low-concentration regions 1151.

The step of introducing the low-concentration n-type impurities shown in FIG. 10E is omitted to obtain TFT 1010 having the offset gate structure in which portions corresponding to the low-concentration n-type regions 1151 have the same impurity concentration as the channel forming region.

However, in the conventional method of producing the LDD structure or offset gate structure TFT 1010, the LDD length or offset length is defined by the distance between an end of the resist mask 1055 and an end of the gate electrode 1014, and thus even when the forming position of the resist mask 1055 is slightly deviated from the gate electrode 1014, this deviation causes the problem of bringing about a variation in the LDD length or offset length.

Therefore, various studies are carried out as to how to manufacture TFT without causing a variation in the LDD length or offset length. However, in many cases, not only N-type TFT 1010 but also P-type TFT are generally formed on the same substrate, and many steps are required for forming such different conduction type TFTS. It is thus undesirable to complicate the manufacturing process even for suppressing a variation in the LDD length or offset length.

Furthermore, besides the TFTs, a capacitor is also formed on the same substrate in some cases. In this capacitor, a semiconductor region formed at the same time as source-drain regions of TFTs serves as an electrode, other electrodes being formed at the same time as gate electrodes of TFTs. Therefore, there is a restriction that impurities must be introduced into a semiconductor film located on the lower layer side of the gate electrode before the gate electrode is formed, thereby causing difficulties in suppressing a variation in the LDD length or offset length without complicating the manufacturing process under the restriction.

Therefore, under the present circumstances, in a method of manufacturing a semiconductor device in which different conduction type TFTs are formed on the same substrate, or a method of manufacturing a semiconductor device in which the capacitor is also formed on the same substrate as these TFTS, a variation in the LDD length or offset length of TFT cannot be sufficiently prevented.

Accordingly, an object of the present invention is to provide a method of manufacturing a semiconductor device which is capable of suppressing a variation in the LDD length or offset length of TFT by a small number of steps for forming different conduction type TFTs on the same substrate, and decreasing defects due to a pattern residue in a wiring region or the like, a method of manufacturing an active matrix substrate, and an electrooptic device comprising the active matrix substrate.

Another object of the present invention is to provide a method of manufacturing a semiconductor device which is capable of decreasing defects due to a pattern residue in a wiring region or a capacitor forming region, a method of manufacturing an active matrix substrate, and an electrooptic device comprising the active matrix substrate.

A further object of the present invention is to provide a method of manufacturing a semiconductor device which is capable of producing different conduction type TFTs and a capacitor by a small number of steps while suppressing a variation in the LDD length of offset length of TFT, a method of manufacturing an active matrix substrate, and an electrooptic device comprising the active matrix substrate.

SUMMARY OF THE INVENTION

In order to solve the above problems, the present invention provides a method of manufacturing a semiconductor device in which LDD structure or offset gate structure first conduction type TFT and self-aligned structure second conduction type TFT are formed from a semiconductor film formed on a substrate, the method comprising the first gate insulating film forming step of forming a first gate insulating film on the surface of the semiconductor film, the first gate electrode forming step of forming a gate electrode forming conductive film on the surface of the first gate insulating film, and then patterning the gate electrode forming conductive film on the second conduction type TFT side while leaving the gate electrode forming conductive film on the first conduction type TFT side to form a gate electrode of the second conduction type TFT, the high-concentration second conduction type impurity introducing step of introducing high-concentration second conduction type impurities into the semiconductor film using the gate electrode forming conductive film and the second conduction type TFT gate electrode as a mask, the second gate electrode forming step of forming a pattering mask of the gate electrode forming conductive film on the surface of the gate electrode forming conductive film left on the first conduction type TFT side, and patterning the gate electrode forming conductive film with the second TFT side covered with the patterning mask to form a gate electrode of the first conduction type TFT, and the first high-concentration first conduction type impurity introducing step of introducing high-concentration first conduction type impurities with the patterning mask left.

The method of the present invention is a method for producing offset gate structure TFT, wherein the first gate insulating film is formed on the surface of the semiconductor film in the first gate insulating film forming step, and then the gate electrode forming conductive film formed on the surface of the first gate insulating film is patterned to the gate electrode on the first conduction type TFT side with leaving the gate electrode forming conductive film on the first conduction type TFT side in the first gate electrode forming step. Therefore, in the high-concentration second conduction type impurity introducing step, high-concentration second conduction type impurities are introduced to form source-drain regions in self alignment with the gate electrode on the second conduction type TFT side. Next, in the second gate electrode forming step, the patterning mask is formed on the surface of the gate electrode forming conductive film left on the first conduction type TFT side to form the gate electrode of first conduction type TFT. Since side etching occurs during etching, the gate electrode is smaller than the patterning mask in either of the width direction and the length direction. Therefore, in the first high-concentration first conduction type impurity introducing step, high-concentration first conduction type impurities are introduced with the patterning mask left to introduce the impurities in self alignment with the patterning mask, to form the source-drain regions. The region of the semiconductor film in which the high-concentration first conduction type impurities are not introduced is wider than the region covered with the gate electrode. Namely, the region covered with the gate electrode becomes the channel forming region, regions (offset regions), into which the high-concentration first conduction type impurities are not introduced, being formed between the source and drain regions on both sides of the channel forming region. The length dimension of the offset regions equals to the amount of side etching which occurs in the formation of the gate electrode. Therefore, no variation occurs in the offset length due to a positional deviation of the mask. In addition, in order to minimize the number of times of mask formation for selectively introducing impurities, impurity introduction into the first conduction type TFT is avoided by the gate electrode forming conductive film in the high-concentration second conduction type impurity introducing step, and impurity introduction into the second conduction type TFT is avoided by the patterning mask in the high-concentration first conduction type impurity introducing step, thereby permitting the manufacture of a semiconductor device by a small number of steps. It is also possible to prevent the occurrence of defects in the wiring region or the capacitor forming region due to the pattern residue.

In the present invention, the first conduction type is N type, and the second conduction type is P type. Namely, although the first and second conduction types may be the P type and N type, respectively, N-type TFT preferably has the LDD structure or offset structure, and P-type TFT preferably has the self-aligned structure because N-type TFT tends to have a significant off-leak current.

In the present invention, with the first conduction type TFT having the LDD structure, the patterning mask may be removed after the first high-concentration first conduction type impurity introducing step, and then low-concentration first conduction type impurities may be introduced into the semiconductor film by using the gate electrode of the first conduction type TFT as a mask in the low-concentration first conduction type impurity introducing step. In this construction, low-concentration source-drain regions are formed on the first TFT side in self alignment with the gate electrode, and the LDD length of the low-concentration source-drain regions equals to the amount of side etching caused in pattering the gate electrode. Therefore, no variation occurs in the LDD length due to a positional deviation of the mask. In the low-concentration first conduction type impurity introducing step of introducing the low-concentration first conduction type impurities, since the patterning mask used for patterning the gate electrode of the first TFT has been removed, the low-concentration first conduction type impurities are also introduced into the second TFT side. However, the low-concentration first conduction type impurities are introduced into the regions into which the high-concentration second conduction type impurities are introduced on the second TFT side. Therefore, even when the low-concentration first conduction type impurities are introduced, the impurity concentration of the regions into which the high-concentration second conduction type impurities are introduced less changes. There is thus no need to cover the mask on the second TFT side in the low-concentration first conduction type impurity introducing step, thereby decreasing the number of the steps.

In the present invention, in the second gate electrode forming step, for example, a mask wider than the gate electrode formed in the first gage electrode forming step is formed as the patterning mask.

In the present invention, where the capacitor is formed on the same substrate as the first conduction type TFT and second conduction type TFT, the impurity introducing step of introducing first or second conduction type impurities into the capacitor forming semiconductor region may be performed before the first gate electrode forming step, and a capacitor electrode may be formed in the first or second gate electrode forming step so as to be confronted to the capacitor forming semiconductor region, which is made conductive in the impurity introducing step, with the first gate insulating film formed therebetween. In this construction, impurities can be selectively introduced into the semiconductor film in the impurity introducing step before the gate electrode is formed, and the capacitor can thus be formed.

Where the capacitor is formed on the same substrate as the first and second conduction type TFTS, high-concentration first or second conduction type impurities may be introduced into the capacitor forming semiconductor region in the high-concentration impurity introducing step between the first gate insulating film forming step and the first gate electrode forming step, and a capacitor electrode may be formed in the first or second gate electrode forming step so as to be confronted to the capacitor forming semiconductor region, which is made conductive in the high-concentration impurity introducing step, with the first gate insulating film formed therebetween. In this construction, impurities can be selectively introduced into the semiconductor film in the high-concentration impurity introducing step before the gate electrode is formed, and the capacitor can thus be formed.

Furthermore, where the capacitor is formed on the same substrate as the first and second conduction type TFTs, the second conduction type TFT side may be covered with a mask, and high-concentration first conduction type impurities may be introduced in a state wherein at least the predetermined first TFT gate electrode forming region is covered with the mask wider than the patterning mask in the second high-concentration first conduction type impurity introducing step before the first gate insulating film forming step and the first gate electrode forming step, and a capacitor electrode may be formed in the first or second gate electrode forming step so as to be confronted to the capacitor forming semiconductor region, which is made conductive in the second high-concentration first conduction type impurity introducing step, with the first gate insulating film formed therebetween. In this construction, impurities can be selectively introduced into the semiconductor film in the second high-concentration first conduction type impurity introducing step before the gate electrode is formed, and the capacitor can thus be formed. In this case, even when the high-concentration first conduction type impurities are introduced on the first TFT side, since at least the predetermined first conduction type TFT gate electrode forming region is covered with a wide mask, the offset length or LDD length of the first conduction type TFT equals to the amount of side etching caused in the formation of the gate electrode at the time when the first conduction type TFT gate electrode is completely formed. Therefore, no variation occurs in the offset length of LDD length due to a positional deviation of the mask.

In the second high-concentration first conduction type impurity introducing step of introducing impurities, impurity introduction on the first conduction type TFT side is avoided by the mask which covers a region wider than the predetermined gate electrode forming region. However, even with some positional deviation in the mask forming position, the high-concentration first conduction type impurities are introduced into a region, which protrudes from the patterning mask, in the first high-concentration first conduction type impurity introducing step. Therefore, there is formed no space in the source-drain regions into which impurities are not introduced.

In the present invention, in the first high-concentration first conduction type impurity introducing step, first conduction type impurities may be introduced with a medium concentration between the dose in the second high-concentration first conduction type impurity introducing step and the dose in the low-concentration first conduction type impurity introducing step.

For example, the first conduction type impurities may be introduced into the semiconductor film in a dose of about $1\times10^{15}$ $cm^{-2}$ or more in the second high-concentration first conduction type impurity introducing step, in a dose of about $1\times10^{13}$ $cm^{-2}$ or less in the low-concentration first conduction type impurity introducing step, and in a dose of about $1\times10^{13}$ $cm^{-2}$ to about $1\times10^{15}$ $cm^{-2}$ in the first high-concentration first conduction type impurity introducing step.

In the present invention, a second gate insulating film may be formed on the surface of the first gate insulating film in the second gate insulating film forming step between the second high-concentration first conduction type impurity introducing step and the first gate electrode forming step.

The method of manufacturing a semiconductor device of the present invention can be applied to, for example, the manufacture of an active matrix substrate with a built-in driving circuit. In this case, pixel switching TFT comprising the first conduction type TFT, driving circuit TFT and driving circuit thin film transistors comprising the second conduction type TFT are formed on the same substrate.

Alternatively, pixel switching TFT comprising the second conduction type TFT, driving circuit TFT and driving circuit thin film transistors comprising the first conduction type TFT may be formed on the same substrate.

An electrooptic material is held between such an active matrix substrate and a counter substrate to produce an electrooptic device.

DETAILED DESCRIPTION OF THE EMBODIMENTS

Embodiments of the present invention will be described with reference to the drawings. In the description below, the first conduction type is N type, and the second conduction type is P type.

[Embodiment 1]

Figure 1:
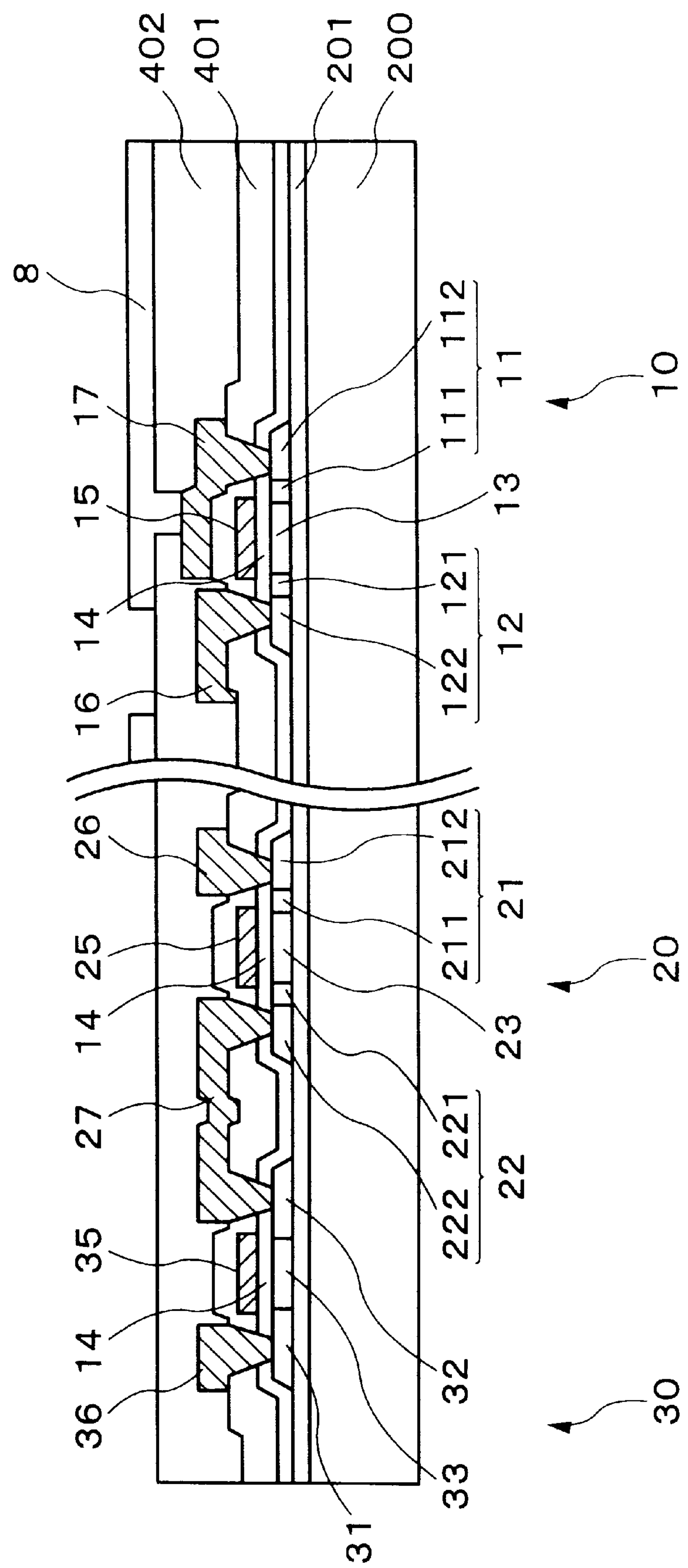
FIG. 1 is a sectional view of an active matrix substrate in accordance with a first embodiment of the present invention.

FIG. 1 is a sectional view of a semiconductor device in accordance with embodiment 1 of the present invention. FIGS. 2 and 3 are sectional views of the steps for manufacturing the semiconductor device. The semiconductor device shown in these drawings comprises an active matrix substrate with a built-in driving circuit used for an electrooptic device (electrooptic device) which will be described below. Therefore, three types of TFTs are formed on the active matrix substrate. FIG. 1 shows N-type pixel switching TFT having the LDD structure, N-type driving circuit TFT having the LDD structure, and P-type driving circuit TFT having the self-aligned structure, which are formed in the direction from the right side to the left side of the drawing.

In FIG. 1, N-type pixel TFT 10, N-type driving circuit TFT 20, and P-type driving circuit TFT 30, which are formed on the active matrix substrate 2, have channel forming regions 13, 23, and 33 for forming channels between source-drain regions 11 and 12, 21 and 22, and 31 and 32, respectively. Where each of the channel forming regions 13, 23 and 33 is doped with a low concentration of boron ions, each of the channel forming regions 13, 23 and 33 is formed as a low-concentration P-type region having an impurity concentration of about $1\times10^{17}$ $cm^{-3}$. In such channel doping, the threshold voltages of the N-type driving circuit TFT 20 and the P-type driving circuit TFT 30 can be set to a predetermined value. Since the mobility of holes is generally lower than that of electrons, the on-current of P-type driving circuit TFT tends to be significantly lower than the on-current of N-type driving circuit TFT. However, this problem can be substantially solved by channel doping for adjusting the threshold voltage. Therefore, in the active matrix substrate 2 of this embodiment, the on-currents of the N-type driving circuit TFT 20 and the P-type driving circuit TFT 30, which constitute a complementary transistor circuit, are well balanced.

The N-type pixel TFT 10, the N-type driving circuit TFT 20, and the P-type driving circuit TFT 30 comprise gate electrodes 15, 25, and 35, respectively, which are provided on the surface sides of the channel forming regions 13, 23, and 33 with a gate insulating layer 14 provided therebetween (an oxide film having a thickness of about 300 angstroms to about 2000 angstroms, preferably about 1000 angstroms).

The source-drain regions of each of the N-type pixel TFT 10 and the N-type driving circuit TFT 20 have the LDD structure. Therefore, the source-drain regions 11 and 12, and 21 and 22 have low-concentration source-drain regions 111 and 121, and 211 and 221, respectively, which have an impurity concentration of $1\times10^{18}$ $cm^{-3}$ and which are formed opposite to the ends of the gate electrodes 15 and 25, respectively, with the gate insulating film 14 provided therebetween. Therefore, these TFTs are brought into a state where the electric field strength at the drain ends is relieved to significantly decrease an off-leak current. In addition, LDD structure TFT has higher electric strength between source and drain than self-aligned structure TFT, and thus the channel length can be shortened.

On the other hand, the source-drain regions 31 and 32 of the P-type driving circuit TFT 30 are formed in self alignment with the gate electrode 35. However, P-type TFT tends to exhibit a lower off-leak current than N-type TFT, and thus has less problem of the off-leak current and the electric strength even when the structure is not the LDD structure. In the present invention, therefore, the P-type driving circuit TFT 30 is provided with the self-aligned structure to ensure the on-current, thereby improving a balance between the on-currents of N-type driving circuit TFT 20 and the P-type driving circuit TFT 30 which constitute the complementary transistor circuit.

In the source-drain regions 11 and 12, and 21 and 22 of the N-type pixel TFT 10 and the N-type driving circuit TFT 20, regions excluding the low-concentration source-drain regions 111 and 121, and 211 and 221 are high-concentration source-drain regions 112 and 122, and 212 and 222, which have an impurity concentration of about $1\times10^{20}$ $cm^{-3}$. In the P-type driving circuit TFT 30, the entire region of each of the source-drain regions 31 and 32 is a high-concentration region having an impurity concentration of about $1\times10^{20}$ $cm^{-3}$. Scanning lines, data lines, and source-drain electrodes 16, 17, 26, 27, and 36 such as pixel electrodes and the like are respectively electrically connected to these high-concentration regions through contact holes of a lower layer side interlayer insulating film 401 and an upper layer side interlayer insulating film 402.

The active matrix substrate 2 having the above structure can be manufactured by, for example, the following method. In the description below, an impurity concentration is shown by an impurity concentration after active annealing.

Figure 2A:
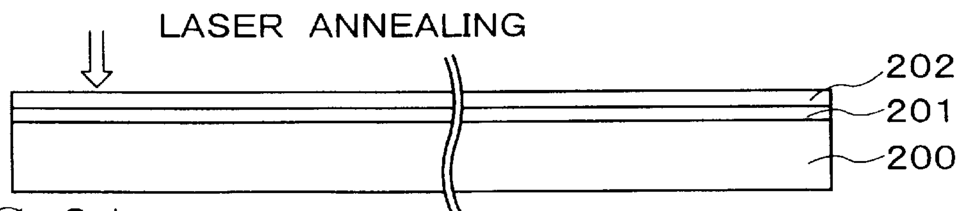
FIGS. 2A to 2E are sectional view respectively showing the steps of a method of manufacturing the active matrix substrate shown in FIG. 1.

First, as shown in FIG. 2A, an under protecting film 201 comprising a silicon oxide film is formed on the surface of an insulating substrate 200 comprising a quartz substrate or glass substrate. Next, an amorphous silicon film 202 is formed by a LPCVD method, a plasma CVD method, or the like, and then changed to a polysilicon film by growing crystal grains by a laser annealing or rapid thermal annealing.

Figure 2B:
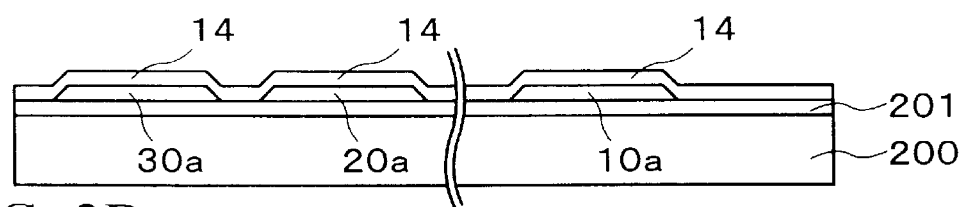

Next, as shown in FIG. 2B, the polysilicon film is patterned by photolithography to leave island-like silicon films 10*a*, 20*a* and 30*a* in regions where the pixel TFT 10, the N-type driving circuit TFT 20, and the P-type driving circuit TFT 30 are respectively formed.

Next, the gate insulating film 14 comprising a silicon oxide film of about 300 angstroms to about 2000 angstroms in thickness is formed on the surfaces of the silicon films 10*a*, 20*a*, and 30*a* by a TEOS-CVD method, a LPCVD method, a plasma CVD method, a thermal oxidation method, or the like (the first gate insulating film forming step). In this step of forming the gate insulating film 14 by using the thermal oxidation method, the silicon films 10*a*, 20*a*, and 30*a* can be crystallized to be changed to polysilicon films.

In channel doping, for example, boron ions are implanted in a dose of about $1\times10^{12}$ $cm^{-2}$ at this timing. As a result, the silicon films 10*a*, 20*a*, and 30*a* are changed to low-concentration P-type silicon films having an impurity concentration of about $1\times10^{17}$ $cm^{-3}$.

Figure 2C:
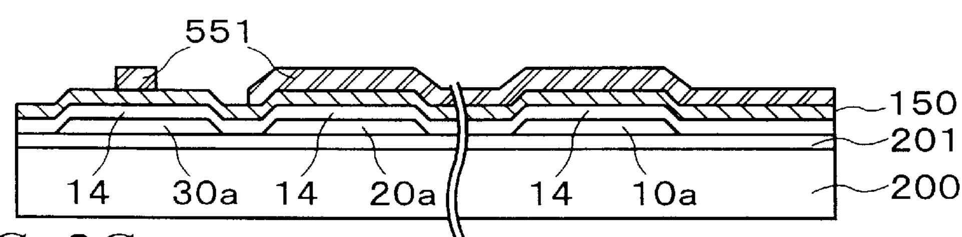
Figure 2D:
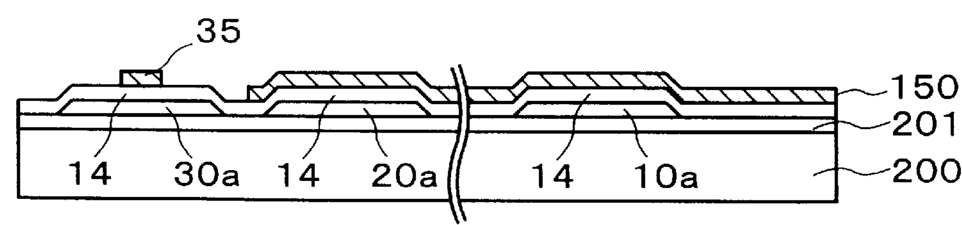

Next, as shown in FIG. 2C, a gate electrode forming conductive film 150 comprising a doped silicon film, a silicide film, or a metal film such as an aluminum film, a chromium film, a tantalum film or the like is formed on the surface of the gate insulating film 14. Next, a patterning mask 551 is formed on the surface of the gate electrode forming conductive film 150, followed by patterning in this state to form a gate electrode 35 on the driving circuit TFT 30 side (the first gate electrode forming step), as shown in FIG. 2D. In this step, on the N-type pixel TFT 10 side and the N-type driving circuit TFT 20 side, the gate electrode forming conductive film 150 is covered with the patterning mask, and thus it is not patterned.

Figure 2E:
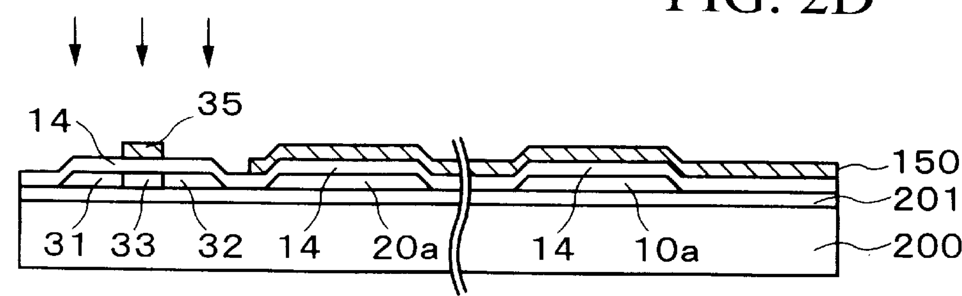

Next, as shown in FIG. 2E, boron ions (the second conduction type/P type) are implanted in a dose of about $1\times10^{15}$ $cm^{-2}$ (high concentration) using, as a mask, the gate electrode 35 on the P-type driving circuit TFT 30 side and the gate electrode forming conductive film 150 left on the N-type pixel TFT 10 side and the N-type driving circuit TFT 20 side (the high concentration second conduction type impurity introducing step). As a result, the high-concentration source-drain regions 31 and 32 having an impurity concentration of $1\times10^{20}$ $cm^{-3}$ are formed in self alignment with the gate electrode 35. In this step, a region covered with the gate electrode 35 serves as the channel forming region 33.

Figure 3A:
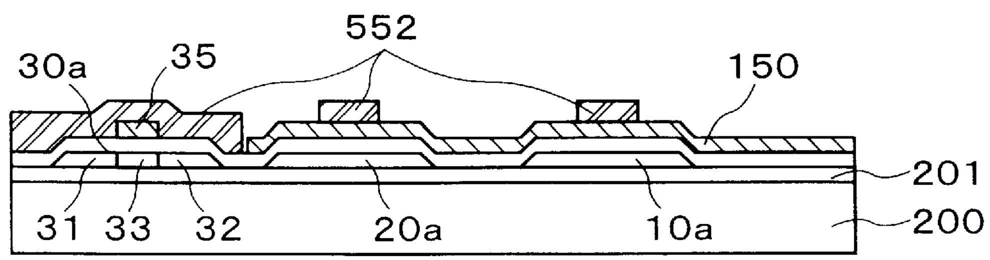
FIGS. 3A to 3D are sectional view respectively showing the steps next to the steps shown in FIG. 2 in the method of manufacturing the active matrix substrate shown in FIG. 1.
Figure 3B:
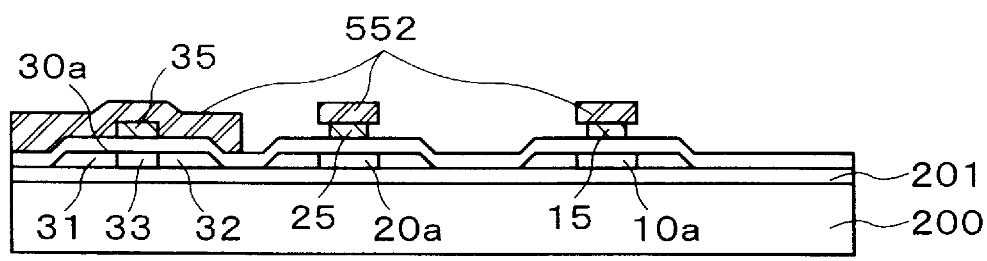

Next, as shown in FIG. 3A, a patterning mask 552 comprising a resist mask is formed to completely cover the P-type driving circuit TFT 30 side, and cover gate electrode forming regions on the N-type pixel TFT 10 side and the N-type driving circuit TFT 20 side. Next, as shown in FIG. 3B, the gate electrode forming conductive film 50 is patterned through the patterning mask 552 to form the gate electrodes 15 and 25 of the N-type pixel TFT 10 and the N-type driving circuit TFT 20 (the second gate electrode forming step). In this patterning, lateral etching (side etching) occurs in the gate electrode forming conductive film 150 covered with the patterning mask 552. Therefore, the gate electrodes 15 and 25 are smaller than the patterning mask 552 in either of the width direction and the length direction.

In the second gate electrode forming step, from the viewpoint that side etching is positively progressed in the gate electrode forming conductive film 150, an etching method having isotropy, such as wet etching or plasma etching, is preferred for the second gate electrode forming step.

Next, phosphorus ions (the first conduction type/N type) are implanted in a dose of $1\times10^{15}$ $cm^{-2}$ (high concentration) with the patterning mask 552 left (the first high-concentration first conduction type impurity introducing step). As a result, impurities are introduced in self alignment with the patterning mask 552 to form the high-concentration source-drain regions 112, 122, 212, and 222. In this step, regions of the silicon films 10*a* and 20*a*, into which a high concentration of phosphorus is not introduced, are wider than the regions covered with the gate electrodes 15 and 25. Namely, there are formed regions of the silicon films 10 and 20*a*, into which a high concentration of phosphorus is not introduced, between the high-concentration source-drain regions 112 and 122, and 212 and 222 on both sides of the regions confronted to the gate electrodes 15 and 25, respectively.

Figure 3C:
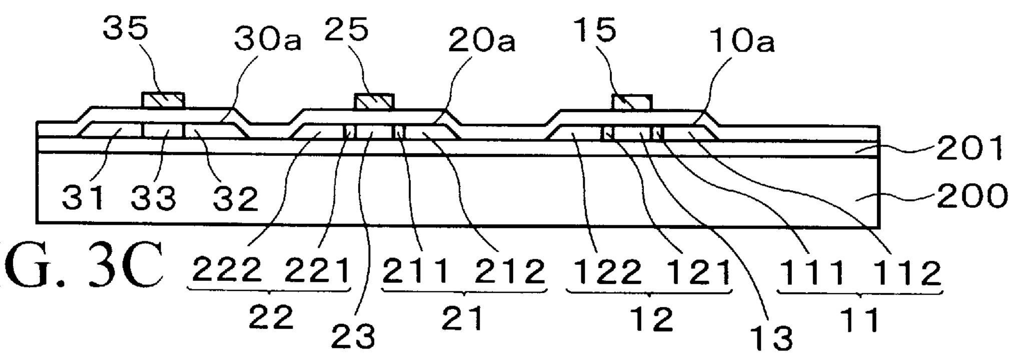

Next, as shown in FIG. 3C, the patterning mask 552 is removed, and in this state, phosphorus ions are implanted in a dose of $1\times10^{13}$ $cm^{-2}$ (low-concentration) (the low-concentration first conduction type impurity introducing step). As a result, a low concentration of impurities is introduced into the silicon films 10*a* and 20*a* in self alignment with the gate electrodes 15 and 25, respectively, to form the low-concentration source-drain regions 111, 121, 211 and 221. The channel regions 13 and 23 are formed in regions overlapped with the gate electrodes 15 and 25, respectively.

Figure 3D:
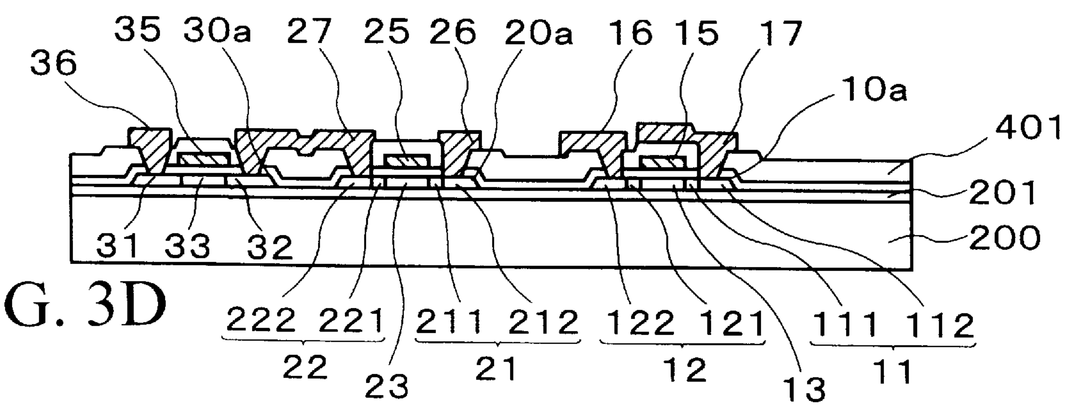

Next, as shown in FIG. 3D, the lower layer side interlayer insulating film 401 is formed on the surface side of the gate electrodes 15, 25, and 35, and contact holes are then formed.

Next, as shown in FIG. 1, the upper layer side interlayer insulating film 402 is formed, and contact holes are then formed. Next, pixel electrodes 8 are formed.

As described above, in this embodiment, in the first gate electrode forming step, the gate electrode forming conductive film 150 formed on the surface of the gate insulating film 14 is left on the N-type pixel TFT 10 side and the N-type driving circuit TFT 20 side, while the gate electrode forming conductive film 150 on the P-type driving circuit TFT 30 side is patterned to the gate electrode 35. In this state, a high concentration of boron ion is introduced in the high-concentration second conduction type impurity introducing step. Therefore, the source-drain regions 31 and 32 are formed on the P-type driving circuit TFT 30 side in self alignment with the gate electrode 35. On the other hand, on the N-type pixel TFT 10 side and the N-type driving circuit TFT 20 side, the gate electrodes 15 and 25 are formed by using the patterning mask 552 in the second gate electrode forming step, and then a high concentration of phosphorus ion is introduced with the pattering mask 552 left in the first high-concentration first conduction type impurity introducing step to introduce impurities in self alignment with the patterning mask 552, to form the high-concentration source-drain regions 112, 122, 212, and 222. In this step of forming the gate electrodes 15 and 25, side etching forms the regions into which a high concentration of phosphorus ion is not introduced, between the high-concentration source-drain regions 112 and 122, and 212 and 222 on both sides of the portions confronted to the gate electrodes 15 and 25, respectively, the length dimension of each of these regions being equal to the amount of side etching in forming the gate electrodes 15 and 25. Therefore, with the patterning mask 552 removed, a low-concentration of phosphorus ion is introduced by using the gate electrodes 15 and 25 as a mask to form the low-concentration source-drain regions 111, 121, 211, and 221 in self alignment with the gate electrodes 15 and 25, the LDD length of each of the low-concentration source-drain regions 111, 121, 211, and 221 being equal to the amount of side etching in patterning the gate electrodes 15 and 25. Therefore, no variation occurs in the LDD length due to a positional deviation of the mask.

Furthermore, impurity introduction on the N-type pixel TFT 10 side and the N-type driving circuit TFT 20 side is avoided by the gate electrode forming conductive film 150 in the high-concentration second conduction type impurity introducing step, and impurity introduction into the N-type driving circuit TFT 20 is avoided by the patterning mask 552 in the high-concentration first conduction type impurity introducing step, thereby minimizing the number of times of mask formation for selectively introducing impurities.

Furthermore, in the low-concentration first conduction type impurity introducing step of introducing a low concentration of phosphorus, a low concentration of phosphorus is introduced on the P-type driving circuit TFT 30 side because the patterning mask 552 has been completely removed. However, since a low concentration of phosphorus is introduced into the high-concentration source-drain regions 31 and 32 on the P-type driving circuit TFT 30 side, even when a low concentration of phosphorus ion is introduced, the impurity concentration of each of the high-concentration source-drain regions 31 and 32 little changes. Therefore, the P-type driving circuit TFT 30 side need not be covered with a mask in the low-concentration first conduction type impurity introducing step, thereby decreasing the number of the steps. It is also possible to prevent the occurrence of defects in the wiring region due to a pattern residue.

By omitting the low-concentration first conduction type impurity introducing step, the N-type pixel TFT 10 and the N-type driving circuit TFT 20 are formed in the offset gate structure.

[Embodiment 2]

Figure 4:
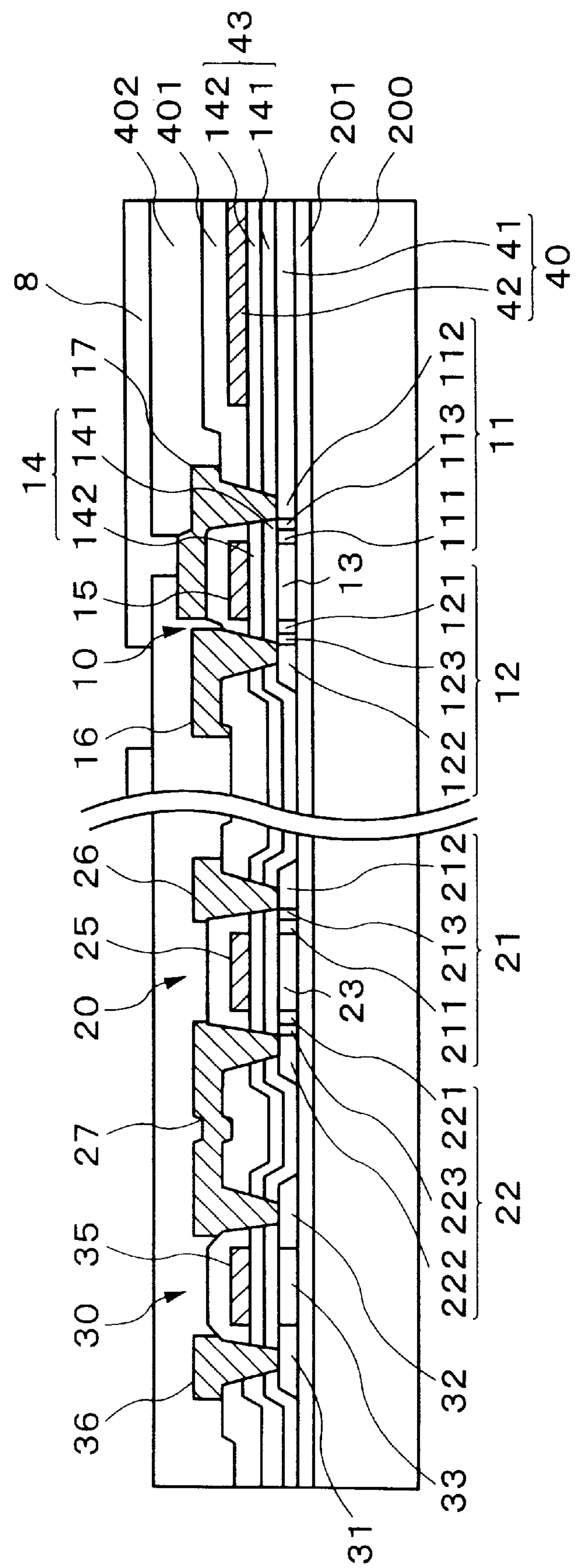
FIG. 4 is a sectional view of an active matrix substrate in accordance with a second embodiment of the present invention.

FIG. 4 is a sectional view of a semiconductor device in accordance with embodiment 2 of the present invention. FIGS. 5 and 6 are sectional views showing the steps for manufacturing the semiconductor device. The semiconductor device shown in these drawings comprises an active matrix substrate with a built-in driving circuit used for an electrooptic device (electrooptic device) which will be described below. Therefore, three types of TFTs are formed on the active matrix substrate. FIG. 4 shows N-type pixel switching TFT having the LDD structure, N-type driving circuit TFT having the LDD structure, and P-type driving circuit TFT having the self-aligned structure, which are formed in the direction from the right side to the left side of the drawing.

In FIG. 4, N-type pixel TFT 10, N-type driving circuit TFT 20, and P-type driving circuit TFT 30, which are formed on the active matrix substrate 2, have channel forming regions 13, 23, and 33 for forming channels between source-drain regions 11 and 12, 21 and 22, and 31 and 32, respectively.

The N-type pixel TFT 10, the N-type driving circuit TFT 20, and the P-type driving circuit TFT 30 comprise gate electrodes 15, 25, and 35, respectively, which are provided on the surface sides of the channel forming regions 13, 23, and 33 with a gate insulating layer 14 (a silicon oxide film having a thickness of about 300 angstroms to about 2000 angstroms, preferably about 1000 angstroms) provided therebetween.

In this embodiment, the gate insulating film 14 comprises a first gate insulating film 141 located on the lower layer side, and a second gate insulating film 142 located on the upper layer side.

The source-drain regions of each of the N-type pixel TFT 10 and the N-type driving circuit TFT 20 have the LDD structure. Namely, the source-drain regions 11 and 12, and 21 and 22 have low-concentration source-drain regions 111 and 121, and 211 and 221, respectively, which have an impurity concentration of about $1\times10^{18}$ $cm^{-3}$ and which are formed opposite to the ends of the gate electrodes 15 and 25, respectively, with the gate insulating film 14 provided therebetween. Therefore, these TFTs are brought into a state where the electric field strength at the drain ends is relieved to significantly decrease an off-leak current. In addition, LDD structure TFT has higher electric strength between source and drain than self-aligned structure TFT, and thus the channel length can be shortened.

In this embodiment, in the source-drain regions 11 and 12, and 21 and 22 of the N-type pixel TFT 10 and the N-type driving circuit TFT 20, high-concentration source-drain regions 112 and 122, and 212 and 222 having an impurity concentration about $1\times10^{20}$ $cm^{-3}$ are formed at predetermined distances from the low-concentration source-drain regions 111 and 121, and 211 and 221, respectively, so that scanning lines, data lines, and source-drain electrodes 16, 17, 26 and 27 such as pixel electrodes and the like are respectively electrically connected to the high-concentration source-drain regions 112, 122, 212 and 222 through contact holes in a lower layer side interlayer insulating film 401 and an upper layer side interlayer insulating film 402.

In this embodiment, medium-concentration source-drain regions 113, 123, 213, and 223 having an impurity concentration of about $1\times10^{19}$ $cm^{-3}$ are formed between the high-concentration source-drain regions 112, 122, 212, and 222, and the low-concentration source-drain regions 111, 121, 211, and 221, respectively.

On the other hand, the source-drain regions 31 and 32 of the P-type driving circuit TFT 30 are formed in self alignment with the gate electrode 35. However, P-type TFT tends to exhibit a lower off-leak current than N-type TFT, and thus has less problem of the off-leak current and the electric strength even when the structure is not the LDD structure. In the present invention, therefore, the P-type driving circuit TFT 30 is provided with the self-aligned structure to ensure a great on-current. In the P-type driving circuit TFT 30, the entire region of each of the source-drain regions 31 and 32 is a high-concentration region having an impurity concentration of about $1\times10^{20}$ $cm^{-3}$, and source-drain electrodes 27 and 36 are respectively electrically connected to these high-concentration regions through contact holes of the lower interlayer insulating film 401 and the upper interlayer insulating film 402.

Furthermore, in this embodiment, a holding capacitor 40 (capacitor) is also formed on the active matrix substrate 2. The holding capacitor 40 comprises a first electrode 41 comprising a semiconductor region, which extends from the high-concentration drain region 112 of the N-type pixel TFT 10, and on which a dielectric film 43 formed at the same time as the gate insulating film 14 having a two-layer structure comprising the first and second gate insulating films 141 and 142 is formed. A second electrode 42 is formed on the dielectric film 43 at the same time as the gate electrode 50 so that the second electrode 42 is confronted to the first electrode 41.

The active matrix substrate 2 having the above structure can be manufactured by, for example, the following method. In the description below, an impurity concentration is shown by an impurity concentration after active annealing.

Figure 5A:
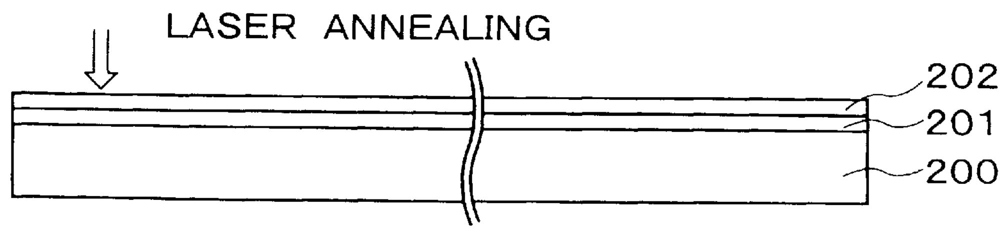
FIGS. 5A to 5D are sectional view respectively showing the steps of a method of manufacturing the active matrix substrate shown in FIG. 4.

First, as shown in FIG. 5A, an under protecting film 201 comprising a silicon oxide film is formed on the surface of an insulating substrate 200 comprising a quartz substrate or glass substrate. Next, an amorphous silicon film 202 is formed by a LPCVD method, a plasma CVD method, or the like, and then changed to a polysilicon film by growing crystal grains by a laser annealing or rapid thermal annealing.

Figure 5B:
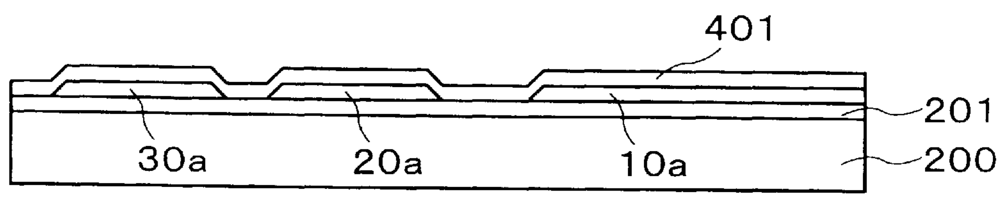

Next, as shown in FIG. 5B, the polysilicon film is patterned by photolithography to leave island-like silicon films 10*a*, 20*a* and 30*a* in regions where the pixel TFT 10, the holding capacitor 40, the N-type driving circuit TFT 20, and the P-type driving circuit TFT 30 are respectively formed (the silicon film forming step).

Next, the first gate insulating film 141 comprising a silicon oxide film of about 150 angstroms to about 1000 angstroms in thickness is formed on the surfaces of the silicon films 10*a*, 20*a*, and 30*a* by a TEOS-CVD method, a LPCVD method, a plasma CVD method, a thermal oxidation method, or the like (the first gate insulating film forming step). In forming the gate insulating films 14, 24 and 34 by using the thermal oxidation method, the silicon films 10*a*, 20*a*, 30*a* and 40*a* can be crystallized to be changed to polysilicon films.

Figure 5C:
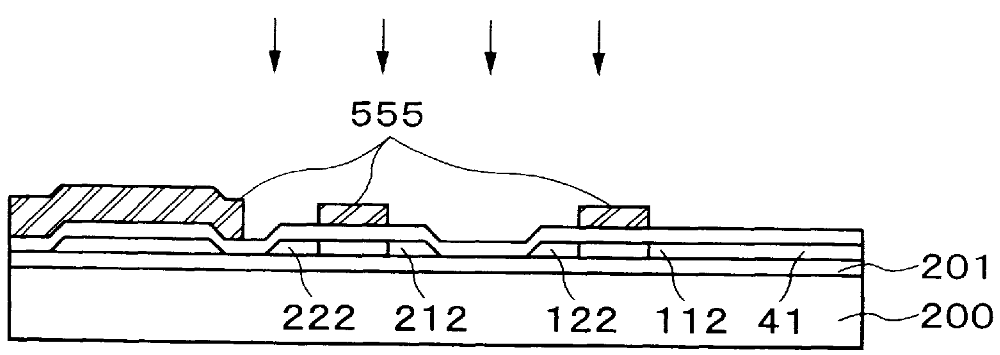

Next, as shown in FIG. 5C, a resist mask 555 is formed to cover the P-type driving circuit TFT 30 side, and predetermined regions where the gate electrodes 15 and 25 of the N-type pixel TFT 10 and the N-type driving circuit TFT 20 are formed, and which are wider than the patterning mask 552 described below. Next, in this state, phosphorus ions (first conduction type/N type) are introduced in a dose (high concentration) of $1\times10^{15}$ $cm^{-2}$ (the second high-concentration first conduction type introducing step).

As a result, high-concentration source-drain regions 112, 122, 212, and 222 having an impurity concentration of about $1\times10^{20}$ $cm^{-3}$ are formed on the N-type pixel TFT 10 side and the N-type driving circuit TFT 20 side. In addition, the first electrode 41 comprising a silicon film having an impurity concentration of about $1\times10^{20}$ $cm^{-3}$ is formed on the holding capacitor 40 side.

Figure 5D:
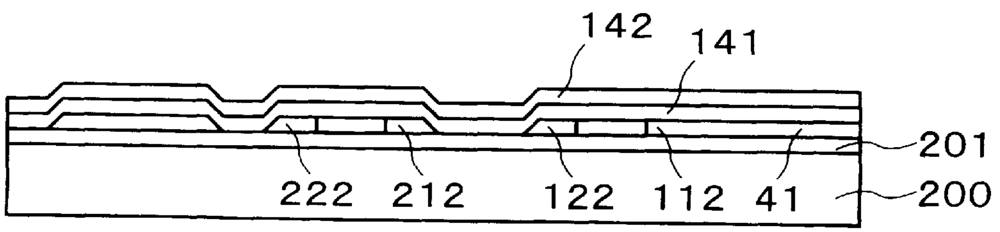

Next, as shown in FIG. 5D, the resist mask 555 is removed, and then the second gate insulating film 142 comprising a silicon oxide film of about 150 angstroms to about 1000 angstroms in thickness is formed on the surfaces of the silicon films 10*a*, 20*a*, and 30*a* by a TEOS-CVD method, a LPCVD method, a plasma CVD method, a thermal oxidation method, or the like (the second gate insulating film forming step).

Figure 6A:
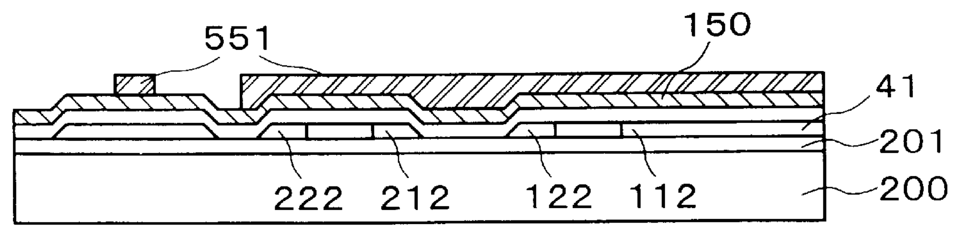
FIGS. 6A to 6F are sectional view respectively showing the steps next to the steps shown in FIG. 5A to 5D in the method of manufacturing the active matrix substrate shown in FIG. 4.
Figure 6B:
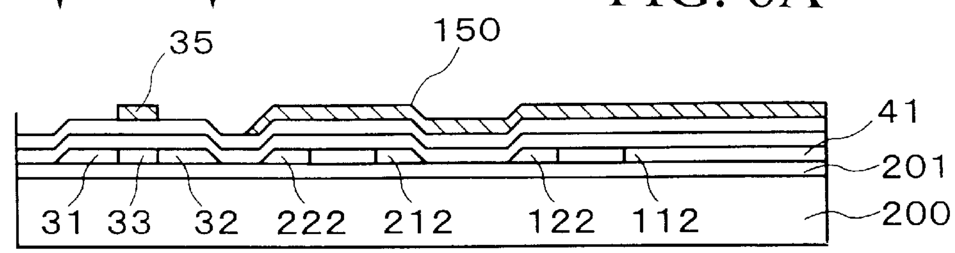

Next, as shown in FIG. 6A, a gate electrode forming conductive film 150 comprising a doped silicon film, a silicide film, or a metal film such as an aluminum film, a chromium film, a tantalum film or the like is formed on the surface of the second gate insulating film 142. Next, a patterning mask 551 is formed on the surface of the gate electrode forming conductive film 150, followed by patterning in this state to form the gate electrode 35 on the driving circuit TFT 30 side (the first gate electrode forming step), as shown in FIG. 6B. In this step, on the N-type pixel TFT 10 side and the N-type driving circuit TFT 20 side, the gate electrode forming conductive film 150 is covered with the patterning mask 551, and thus it is not patterned.

Next, boron ions (the second conduction type/P type) are implanted in a dose of about $1\times10^{15}$ $cm^{-2}$ (high concentration) using, as a mask, the gate electrode 35 on the P-type driving circuit TFT 30 side and the gate electrode forming conductive film 150 left on the N-type pixel TFT 10 side and the N-type driving circuit TFT 20 side (the high concentration second conduction type impurity introducing step). As a result, the high-concentration source-drain regions 31 and 32 having an impurity concentration of $1\times10^{20}$ $cm^{-3}$ are formed in self alignment with the gate electrode 35. In this step, a region covered with the gate electrode 35 serves as the channel forming region 33.

Figure 6C:
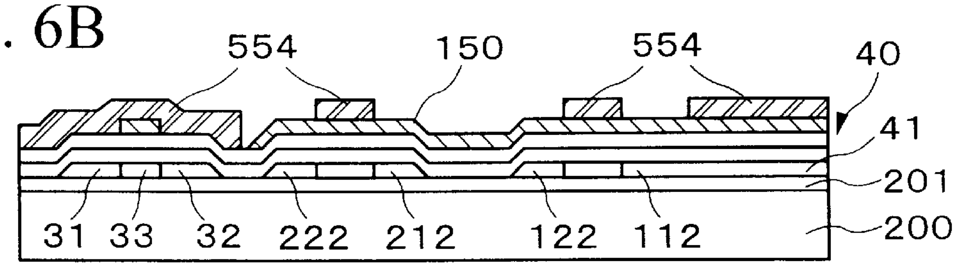
Figure 6D:
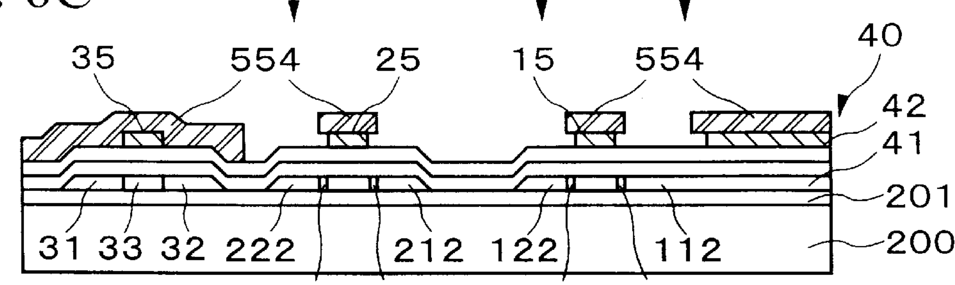

Next, as shown in FIG. 6C, a patterning mask 554 comprising a resist mask is formed to completely cover the P-type driving circuit TFT 30 side, and cover gate electrode forming regions on the N-type pixel TFT 10 side and the N-type driving circuit TFT 20 side, and the holding capacitor 40 side. Next, as shown in FIG. 6D, the gate electrode forming conductive film 150 is patterned through the patterning mask 554 to form the gate electrodes 15 and 25 of the N-type pixel TFT 10 and the N-type driving circuit TFT 20, and the second electrode 42 of the holding capacitor 40 (the second gate electrode forming step). In this patterning, lateral etching (side etching) occurs in the gate electrode forming conductive film 150 covered with the patterning mask 554. Therefore, the gate electrodes 15 and 25 are smaller than the patterning mask 554 in either of the width direction and the length direction.

In the second gate electrode forming step, from the viewpoint that side etching is positively progressed in the gate electrode forming conductive film 150, an etching method having isotropy, such as wet etching or plasma etching, is preferred for the second gate electrode forming step.

Next, phosphorus ions (the first conduction type/N type) are implanted in a dose of $1\times10^{14}$ $cm^{-2}$ (medium concentration) with the patterning mask 554 left (the first high-concentration first conduction type impurity introducing step). In this step, phosphorus ions are introduced with a medium concentration lower than that for forming the high-concentration source-drain regions 111, 121, 211, and 221. As a result, impurities are introduced in self alignment with the patterning mask 554 to form the medium-concentration source-drain regions 113, 123, 213, and 223. In this step, a high concentration of phosphorus ion may be introduced in place of a medium concentration.

In this step, regions of the silicon films 10*a* and 20*a*, into which a high or medium concentration of phosphorus is not introduced, are wider than the regions covered with the gate electrodes 15 and 25. Namely, there are formed regions in the silicon films 10 and 20*a*, into which phosphorus is not introduced, between the medium-concentration source-drain regions 113 and 123, and 213 and 223 on both sides of the regions confronted to the gate electrodes 15 and 25, respectively.

Figure 6E:
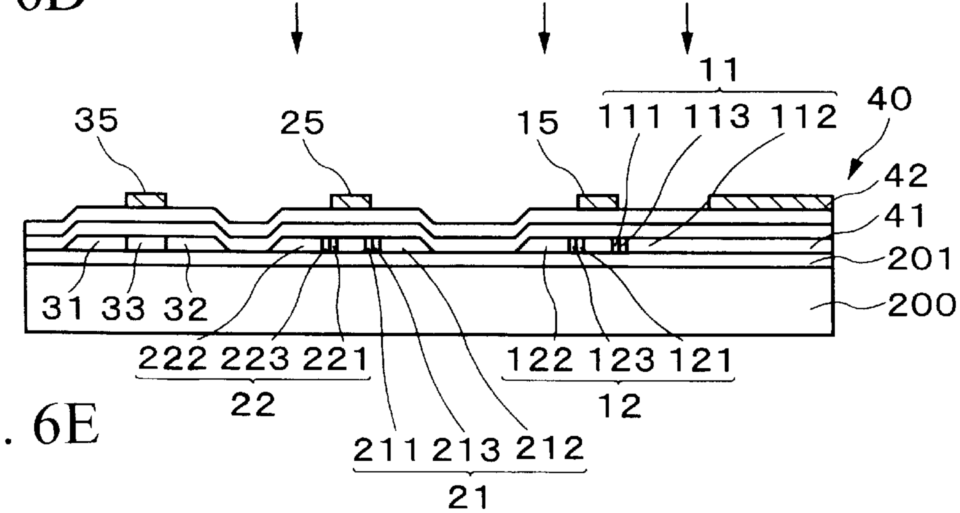

Next, as shown in FIG. 6E, the patterning mask 554 is removed, and in this state, phosphorus ions are implanted in a dose of $1\times10^{13}$ $cm^{-2}$ (low concentration) (the low-concentration first conduction type impurity introducing step). As a result, a low concentration of impurities is introduced into the silicon films 10*a* and 20b in self alignment with the gate electrodes 15 and 25, respectively, to form the low-concentration source-drain regions 111, 121, 211 and 221. The channel regions 13 and 23 are formed in regions overlapped with the gate electrodes 15 and 25, respectively.

Figure 6F:
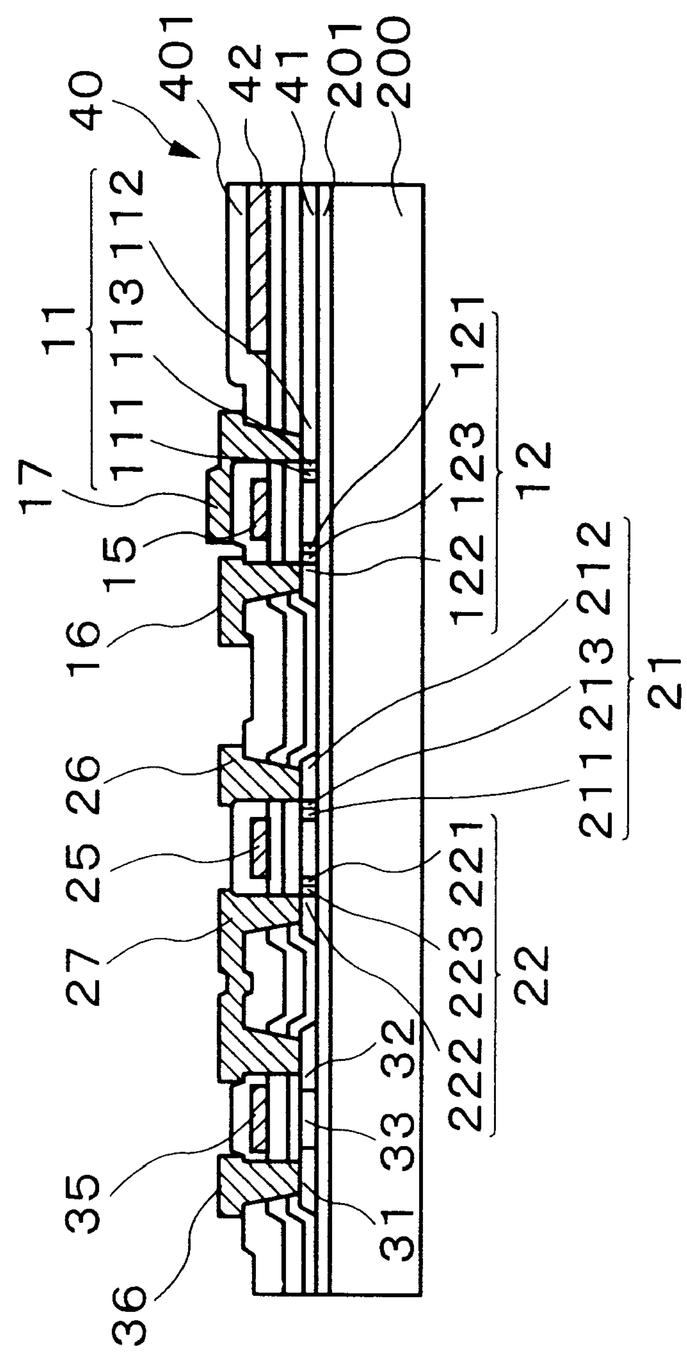

Next, as shown in FIG. 6F, the lower layer side interlayer insulating film 401 is formed on the surface side of the gate electrodes 15, 25, and 35, and contact holes are then formed. Then, the source-drain electrodes 16, 17, 26, 27 and 36 are formed.

Next, as shown in FIG. 1, the upper layer side interlayer insulating film 402 is formed, and contact holes are then formed. Next, pixel electrodes 8 are formed.

As described above, in this embodiment, in the first gate electrode forming step, the gate electrode forming conductive film 150 formed on the surfaces of the gate insulating films 14, 24 and 34 is left on the N-type pixel TFT 10 side and the N-type driving circuit TFT 20 side, while the gate electrode forming conductive film 150 on the P-type driving circuit TFT 30 side is patterned to the gate electrode 35. In this state, a high concentration of boron ion is introduced in the high-concentration second conduction type impurity introducing step. Therefore, the source-drain regions 31 and 32 are formed on the P-type driving circuit TFT 30 side in self alignment with the gate electrode 35. On the other hand, on the N-type pixel TFT 10 side and the N-type driving circuit TFT 20 side, the gate electrodes 15 and 25 are formed by using the patterning mask 554 in the second gate electrode forming step, and then a medium concentration of phosphorus ion is introduced with the pattering mask 554 left in the first high-concentration first conduction type impurity introducing step to introduce impurities in self alignment with the patterning mask 554, to form the medium-concentration source-drain regions 113, 123, 213, and 223. In this step of forming the gate electrodes 15 and 25, side etching forms the regions into which a high concentration of phosphorus ion is not introduced, between the high-concentration source-drain regions 112 and 122, and 212 and 222 on both sides of the portions confronted to the gate electrodes 15 and 25, respectively, the length dimension of each of these regions being equal to the amount of side etching in forming the gate electrodes 15 and 25.

Therefore, with the patterning mask 554 removed, a low concentration of phosphorus ion is introduced by using the gate electrodes 15 and 25 as a mask to form the low-concentration source-drain regions 111, 121, 211, and 221 in self alignment with the gate electrodes 15 and 25, the LDD length of each of the low-concentration source-drain regions 111, 121, 211, and 221 being equal to the amount of side etching in patterning the gate electrodes 15 and 25. Therefore, no variation occurs in the LDD length due to a positional deviation of the mask.

Furthermore, since impurities are introduced in the second high-concentration first conduction type impurity introducing step before the gate electrodes 15, 25, and 35 are formed, the first electrode 41 of the holding capacitor 40 can be formed. At this time, impurity introduction on the N-type pixel TFT 10 side and the N-type driving circuit TFT 20 side is avoided by the resist mask 555 which covers regions wider than the predetermined forming regions of the gate electrodes 15 and 25. However, even when some positional deviation occurs in the formation position of the resist mask 555, a medium concentration of phosphorus ions is introduced into the regions, which protrude from the patterning mask 554, in the first high-concentration first conduction type impurity introducing step. Therefore, there is no region in the source-drain regions 11, 12, 21, and 22 into which impurities are not introduced.

Furthermore, impurity introduction on the N-type pixel TFT 10 side and the N-type driving circuit TFT 20 side is avoided by the gate electrode forming conductive film 150 in the high-concentration second conduction type impurity introducing step, and impurity introduction into the P-type driving circuit TFT 30 is avoided by the patterning mask 554 in the high-concentration first conduction type impurity introducing step, thereby minimizing the number of times of mask formation for selectively introducing impurities. Therefore, the active matrix substrate 2 can be manufactured by a small number of steps. In addition, it is possible to prevent the occurrence of defects in the wiring region and the formation region of the holding capacitor 40 due to a pattern residue.

Furthermore, in the low-concentration first conduction type impurity introducing step of introducing a low concentration of phosphorus, a low concentration of phosphorus is introduced on the P-type driving circuit TFT 30 side because the patterning mask 552 has been completely removed. However, since a low concentration of phosphorus is introduced into the high-concentration source-drain regions 31 and 32 on the P-type driving circuit TFT 30 side, even when a low concentration of phosphorus ion is introduced, the impurity concentration of each of the high-concentration source-drain regions 31 and 32 little changes. Therefore, the P-type driving circuit TFT 30 side need not be covered with a mask in the low-concentration first conduction type impurity introducing step, thereby decreasing the number of the steps.

By omitting the low-concentration first conduction type impurity introducing step, the N-type pixel TFT 10 and the N-type driving circuit TFT 20 are formed in the offset gate structure. The second electrode 42 of the holding capacitor 40 may be formed by patterning in the first gate electrode forming step.

[Other Embodiments]

Although, in the above embodiments, the pixel TFT comprises N-type TFT, the pixel TFT may comprise P-type TFT.

Where the holding capacitor 40 is formed on the same substrate as the N-type TFTs 10 and 20 and P-type TFT 30, an impurity introducing step of introducing P-type impurities into a capacitor forming semiconductor region of a semiconductor film may be performed before the first gate electrode forming step, and in the first or second gate electrode forming step, the second electrode 42 of the capacitor may be formed opposite to the capacitor forming semiconductor region, which is made conductive by the impurity introducing step, with the first gate insulating film 14 provided therebetween.

Where the holding capacitor 40 is formed on the same substrate as the N-type TFTs 10 and 20 and P-type TFT 30, alternatively, a high-concentration impurity introducing step of introducing a high concentration of P-type impurities into a capacitor forming semiconductor region may be performed between the first gate insulating film forming step and the first gate electrode forming step, and in the first or second gate electrode forming step, the second electrode 42 of the capacitor may be formed opposite to the capacitor forming semiconductor region, which is made conductive by the high-concentration impurity introducing step, with the first gate insulating film 14 provided therebetween. In this construction, impurities can be selectively introduced into the semiconductor film before the gate electrode is formed so that the holding capacitor 40 can be formed by using the semiconductor region and the second electrode 42 of the capacitor element, which is formed by the first or second gate electrode forming step.

Although, in the above embodiments, the first conduction type is the N type, and the second conduction type is the P type, by using the P type and N type as the first and second conduction types, respectively, pixel TFT can be formed of P-type TFT, and the capacitor can be formed by using a P-type region.

[Entire Construction of Active Matrix Substrate]

Figure 7:
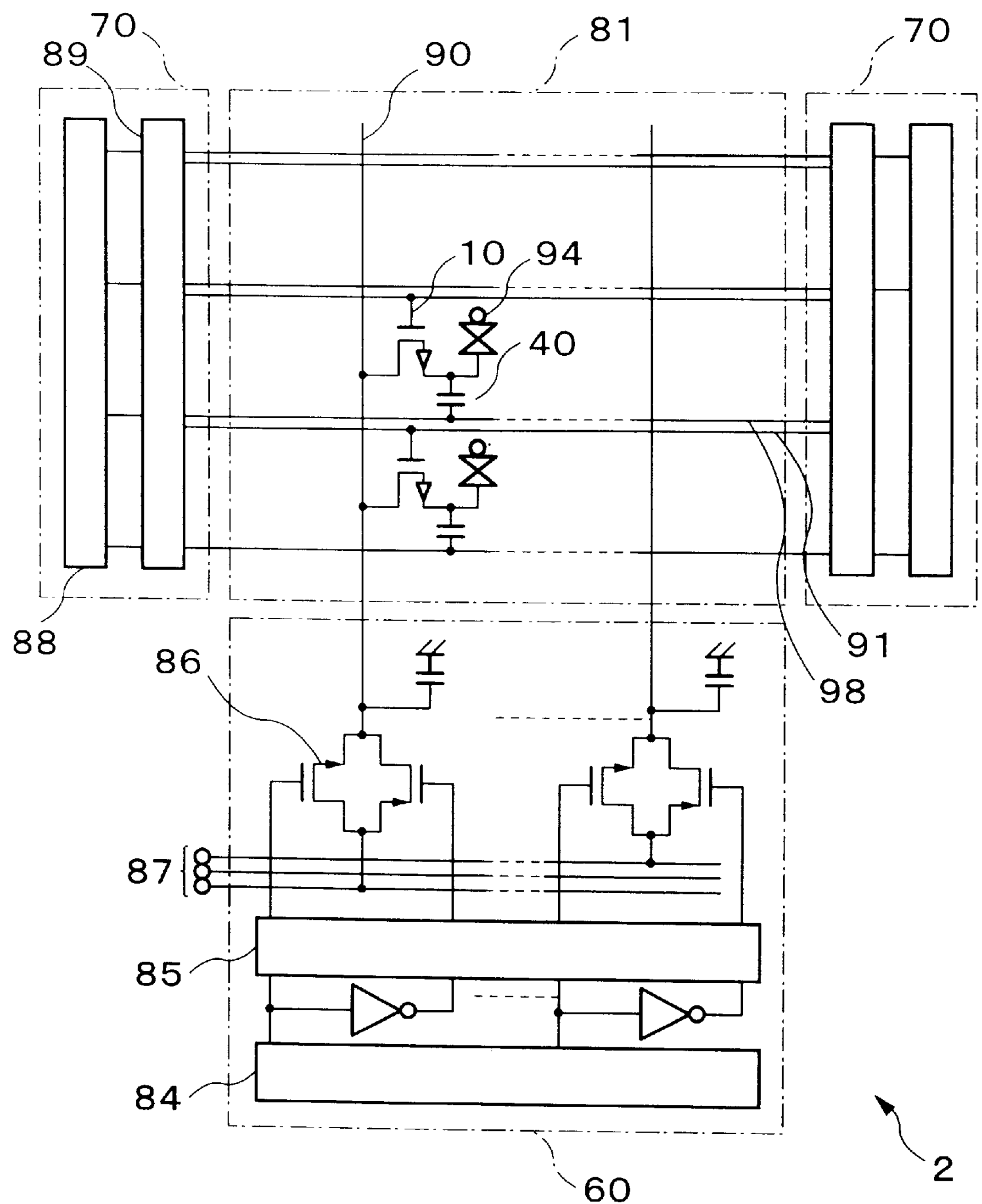
FIG. 7 is a block diagram showing the construction of an active matrix substrate for an electrooptic device to which the present invention is applied.

FIG. 7 is a block diagram schematically showing the construction of an electrooptic device.

As shown in FIG. 7, data lines 90 and scanning lines 91 are formed on an active matrix substrate 2 for an electrooptic device. A gate electrode of pixel TFT 10 connected to a pixel electrode of each pixel is connected to the corresponding scanning line 91, and a source of the pixel electrode 10 is connected to the corresponding data line 90. A liquid crystal cell 94 into which a pixel signal is input through the pixel TFT 10 is present in each pixel. For the data lines 90, a data line driving circuit 60 comprising a shift register 84, a level shifter 85, video lines 87, and analogue switches 86 is formed on the active matrix substrate 2. For the scanning lines 91, a scanning line driving circuit 70 comprising a shift register 88 and a level shifter 89 is formed on the active matrix substrate 2.

Each of these scanning line driving circuit 70 and data line driving circuit 60 comprises the N-type driving circuit TFT 20 and the P-type driving circuit TFT 30 described above with reference to FIGS. 1 to 4.

As described above with reference to FIG. 4, in some cases, each pixel has a holding capacitor 40 (capacitor) formed between each pixel and a capacity line 98 (the second electrode 42), the holding capacitor 40 having the function to increase the charge holding property of the liquid crystal cell 94.

[Application Example of Active Matrix Substrate]

Figure 8:
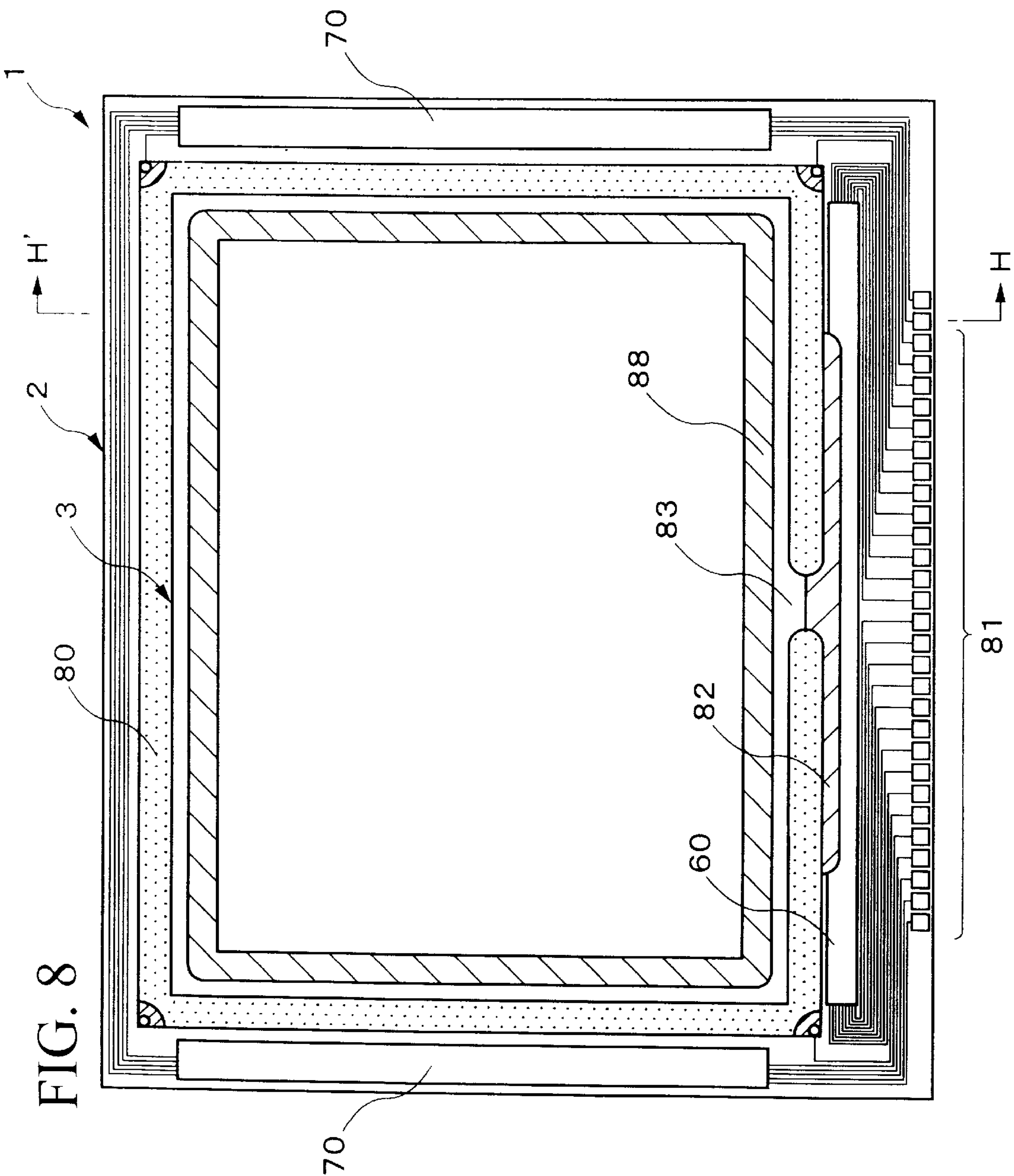
FIG. 8 is a plan view of an electrooptic device as an application example of an active matrix substrate.
Figure 9:
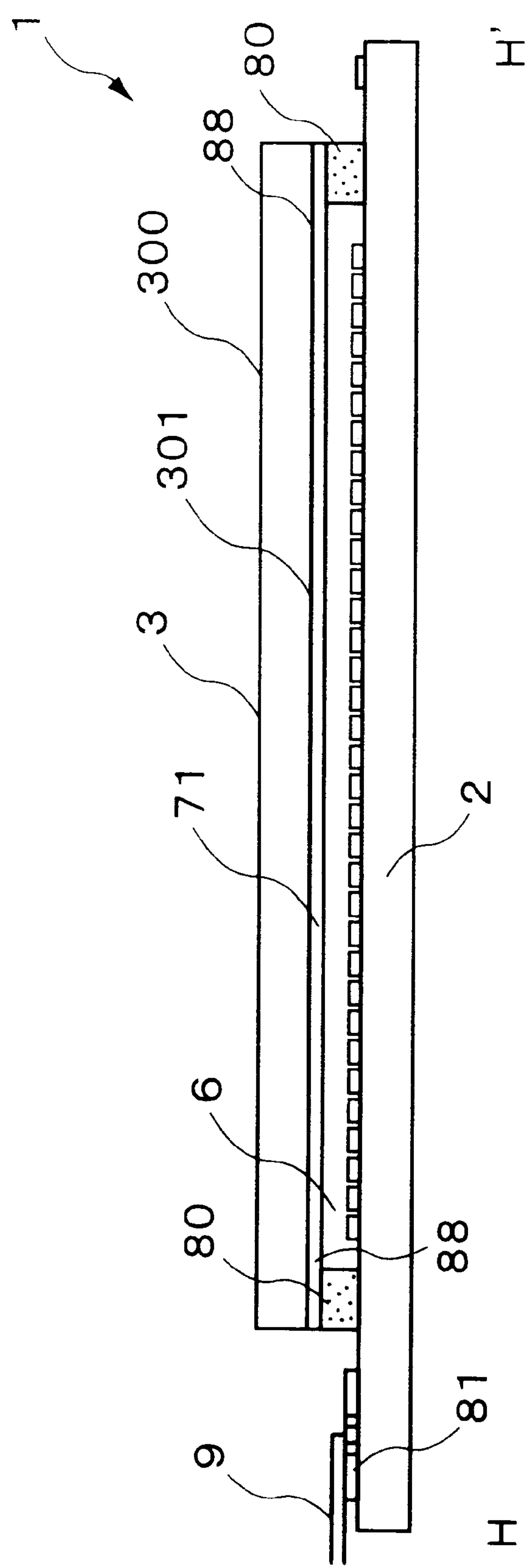
FIG. 9 is a sectional view of the electrooptic device shown in FIG. 8, taken along line H–H' in FIG. 8.
Figure 10A:
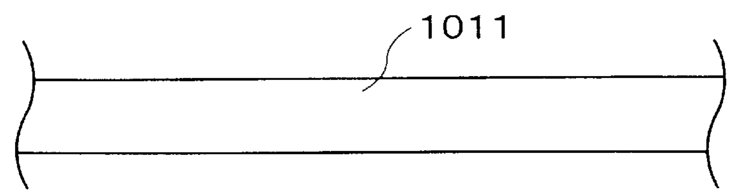
FIGS. 10A to 10H is a sectional view showing the steps of a method of manufacturing conventional TFT having a LDD structure or offset gate structure.
Figure 10B:
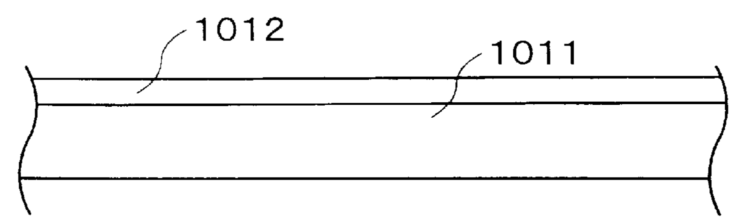
Figure 10C:
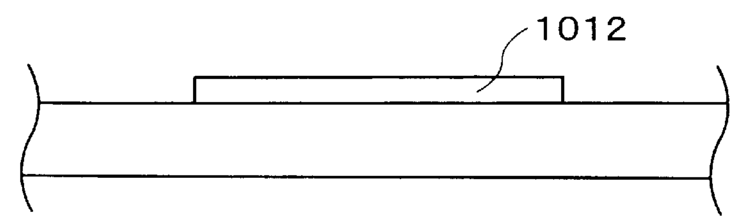
Figure 10D:
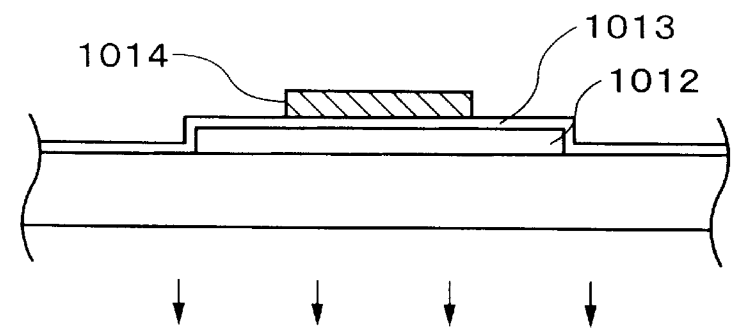
Figure 10E:
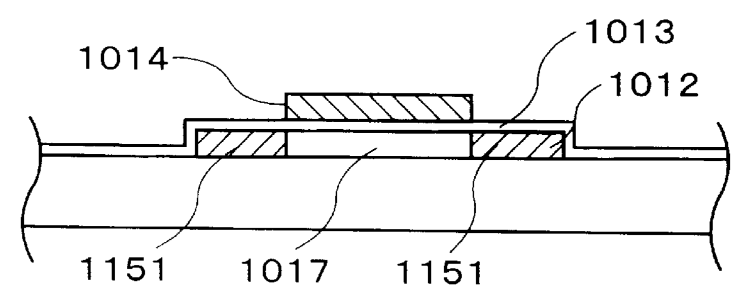
Figure 10F:
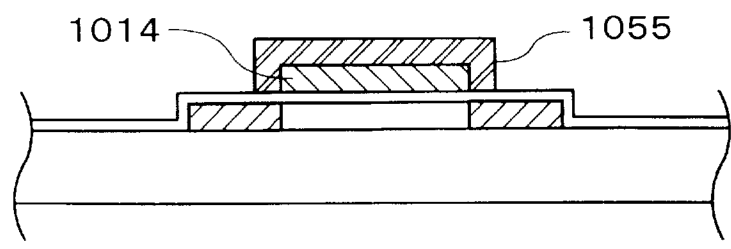
Figure 10G:
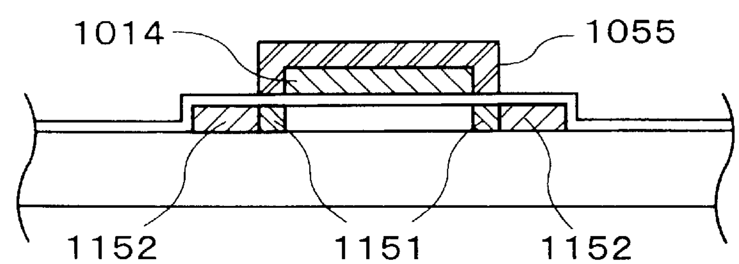
Figure 10H:
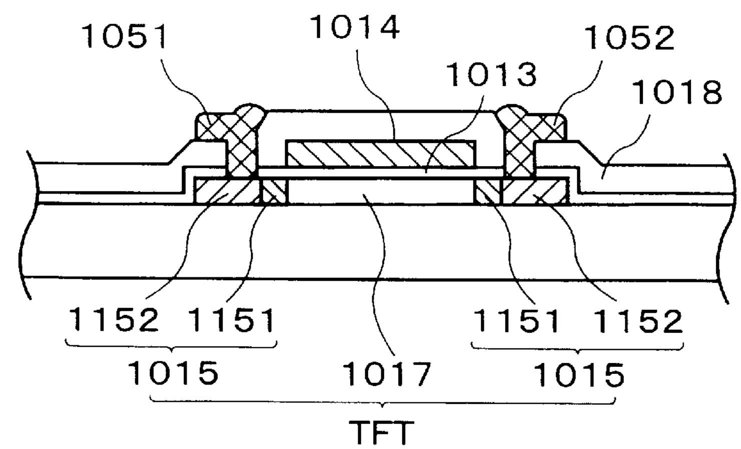

The active matrix substrate 2 having the above-described construction constitutes an electrooptic device, as shown in FIGS. 8 and 9.

FIGS. 8 and 9 are a plan view of an electrooptic device and a sectional view taken long line H–H' in FIG. 8, respectively.

In these drawings, an electrooptic device 1 schematically comprises the above-mentioned active matrix substrate 2, a counter substrate 3 comprising a transparent insulating substrate 3 such as a quartz substrate or a high-heat-resistant glass substrate, on which a counter electrode 71 and a matrix-formed light shielding film 301 are formed, and a liquid crystal 6 held between these substrates. The active matrix substrate 2 and the counter substrate 3 are combined together with a predetermined gap therebetween which is formed by a seal layer 80 composed of a gap material-containing sealing agent so that the liquid crystal 6 is sealed between both substrates. As the seal layer 80, any of various ultraviolet curable resins such as epoxy resins and the like can be used. As the gap material, inorganic or organic fibers or spheres of about 2 to 10 $\mu$m, can be used. The counter substrate 3 is smaller in size than the active matrix substrate 2 and is thus combined with the active matrix substrate 2 in a state where the peripheral portion of the active matrix substrate 2 projects from the periphery of the counter substrate 3. Therefore, the scanning line driving circuit 60 and the data line driving circuit 70 are located outside the counter substrate 3. Since input-output terminals 81 of the active matrix substrate 2 are also located outside the counter substrate 3, a flexible printed wiring board 9 can be joined to the input-output terminals 81. Since the seal layer 8 is partially cut off to form a liquid crystal inlet 83 comprising this cut-off portion. After the counter substrate 3 and the active matrix substrate 2 are combined, therefore, the inside region of the seal layer 8 is put into a vacuum state so that the liquid crystal 6 can be injected through the liquid crystal inlet 83 under reduced pressure, and the liquid crystal inlet 83 may be closed with a sealant 82 after the liquid crystal 6 is sealed. The counter substrate 3 also comprises the light shielding film 88 which is formed thereon for parting a display region inside the seal layer 80.

As described above, in the present invention, a high concentration of first conduction type impurities is introduced with a patterning mask left after a first conduction type TFT gate electrode is formed so that the impurities are introduced in self alignment with the patterning mask. Therefore, after the patterning mask is removed, a low concentration of first conduction type impurities is introduced into regions in which the high concentration of first conduction type impurities is not introduced, to form low-concentration source-drain regions in self alignment with the gate electrode on the first TFT side, the LDD length of each of the source-drain regions being equal to the amount of side etching caused by patterning the gate electrode. Therefore, no variation occurs in the LDD length due to a positional deviation of the mask. In addition, the formation of a mask for selectively introducing impurities is minimized to decrease the number of manufacturing steps.

What is claimed is:

1. A method of manufacturing a semiconductor device comprising a first conduction type thin film transistor and a second conduction type thin film transistor which are formed on a substrate, the method comprising:

the first gate insulating film forming step of forming a first gate insulating film on the surface of a semiconductor film which constitutes the thin film transistors;

the first gate electrode forming step of forming a gate electrode forming conductive film on the surface of the first gate insulating film, and then patterning the gate electrode forming conductive film on the second conduction type thin film transistor side while leaving the gate electrode forming conductive film on the first conduction type thin film transistor side to form a gate electrode of the second conduction type thin film transistor;

the high-concentration second conduction type impurity introducing step of introducing high-concentration second conduction type impurities into the semiconductor film using the gate electrode forming conductive film and the gate electrode of the second conduction type thin film transistor as a mask;

the second gate electrode forming step of forming a pattering mask for the gate electrode forming conductive film on the surface of the gate electrode forming conductive film left on the first conduction type thin film transistor side, and patterning the gate electrode forming conductive film with the second thin film transistor side covered with the patterning mask to form a gate electrode of the first conduction type thin film transistor; and the first high-concentration first conduction type impurity introducing step of introducing high-concentration first conduction type impurities with the patterning mask left.

2. A method of manufacturing a semiconductor device according to claim 1, wherein the first conduction type thin film transistor is a N type thin film transistor, and the second conduction type thin film transistor is P type thin film transistor.

3. A method of manufacturing a semiconductor device according to claim 1 or 2, further comprising the low-concentration first conduction type impurity introducing step of removing the patterning mask after the first high-concentration first conduction type impurity introducing step, and then introducing low-concentration first conduction type impurities into the semiconductor film by using the gate electrode of the first conduction type thin film transistor as a mask.

4. A method of manufacturing a semiconductor device according to claim 1, wherein in the second gate electrode forming step, a mask wider than the gate electrode formed in the first gage electrode forming step is formed as the patterning mask.

5. A method of manufacturing a semiconductor device according to claim 1, further comprising the impurity introducing step of introducing first or second conduction type impurities into a capacitor forming semiconductor region of the semiconductor film before the first gate electrode forming step;

wherein a capacitor electrode is formed in the first or second gate electrode forming step so as to be confronted to the capacitor forming semiconductor region, which is made conductive in the impurity introducing step, with the first gate insulating film formed therebetween.

6. A method of manufacturing a semiconductor device according to claim 1, further comprising the high concentration impurity introducing step of introducing a high concentration of first or second conduction type impurities in the capacitor forming semiconductor region between the first gate insulating film forming step and the first gate electrode forming step;

wherein a capacitor electrode is formed in the first or second gate electrode forming step so as to be confronted to the capacitor forming semiconductor region, which is made conductive in the high-concentration impurity introducing step, with the first gate insulating film formed therebetween.

7. A method of manufacturing a semiconductor device according to claim 1, further comprising the second high-concentration first conduction type impurity introducing step of covering the second conduction type thin film transistor side with a mask, and introducing high-concentration first conduction type impurities in a state wherein at least the predetermined first thin film transistor gate electrode forming region is covered with the mask wider than the patterning mask between the first gate insulating film forming step and the first gate electrode forming step;

wherein a capacitor electrode is formed in the first or second gate electrode forming step so as to be confronted to the capacitor forming semiconductor region, which is made conductive in the second high-concentration first conduction type impurity introducing step, with the first gate insulating film formed therebetween.

8. A method of manufacturing a semiconductor device according to claim 7, wherein in the first high-concentration first conduction type impurity introducing step, first conduction type impurities are introduced with a medium concentration between the dose in the second high-concentration first conduction type impurity introducing step and the dose in the low-concentration first conduction type impurity introducing step.

9. A method of manufacturing a semiconductor device according to claim 8, wherein the first conduction type impurities are introduced into the semiconductor film in a dose of about $1\times10^{15}$ $cm^{-2}$ or more in the second high-concentration first conduction type impurity introducing step, in a dose of about $1\times10^{13}$ $cm^{-2}$ or less in the low-concentration first conduction type impurity introducing step, and in a dose of about $1\times10^{13}$ $cm^{-2}$ to about $1\times10^{15}$ $cm^{-2}$ in the first high-concentration first conduction type impurity introducing step.

10. A method of manufacturing a semiconductor device according to any one of claims 6 to 9, further comprising the second gate insulating film forming step of forming a second gate insulating film on the surface of the first gate insulating film between the second high-concentration first conduction type impurity introducing step and the first gate electrode forming step.

11. A method of manufacturing an active matrix substrate comprising a pixel switching thin film transistor and driving circuit thin film transistor, each of which comprises a first conduction type thin film transistor, and a driving circuit thin film transistor comprising a second conduction type thin film transistor on the same substrate by a method of manufacturing a semiconductor device according to claim 1.

* * * * *

UNITED STATES PATENT AND TRADEMARK OFFICE

CERTIFICATE OF CORRECTION

PATENT NO. : 6,306,693 B1
DATED : October 23, 2001
INVENTOR(S) : Ishiguro et al.

It is certified that error appears in the above-identified patent and that said Letters Patent is hereby corrected as shown below:

Title page,
Item [30], Foreign Application Priority information should read:

-- [30] Foreign Application Priority Data

Sep. 10, 1999 (JP) ………………………….. 11-257697 --

Signed and Sealed this

Fourteenth Day of January, 2003

JAMES E. ROGAN
*Director of the United States Patent and Trademark Office*